United States Patent
Ouacha et al.

(10) Patent No.: US 6,556,096 B1
(45) Date of Patent: Apr. 29, 2003

(54) ARTIFICIAL LINE

(75) Inventors: Aziz Ouacha, Atvidaberg (SE); Börje Carlegrim, Linghem (SE)

(73) Assignee: Totalförsvarets Forskningsinstitut, Stockholm (SE)

( * ) Notice: Subject to any disclaimer, the term of this patent is extended or adjusted under 35 U.S.C. 154(b) by 0 days.

(21) Appl. No.: 09/581,199

(22) PCT Filed: Nov. 10, 1998

(86) PCT No.: PCT/SE98/02021

§ 371 (c)(1),
(2), (4) Date: Jun. 19, 2000

(87) PCT Pub. No.: WO99/35740

PCT Pub. Date: Jul. 15, 1999

(30) Foreign Application Priority Data

Dec. 19, 1997 (SE) ............................................ 9704758

(51) Int. Cl.⁷ ................................................ H04B 3/40
(52) U.S. Cl. ........................... 333/23; 333/138; 333/156
(58) Field of Search ........................... 333/23, 138–140, 333/156

(56) References Cited

U.S. PATENT DOCUMENTS

| 4,443,772 A | 4/1984 | Schwarzmann | ........... 333/28 R |
| 4,885,562 A | 12/1989 | Ouvrard et al. | ............. 333/139 |

OTHER PUBLICATIONS

H954; U.S. Statutory Invention Registration; Aug. 6, 1991 Lang et al.
Proceedings of the 33rd Midwest Symposium on Circuits and Systems, Aug. 12–15, 1990.

*Primary Examiner*—Robert Pascal
*Assistant Examiner*—Kimberly E Glenn
(74) *Attorney, Agent, or Firm*—Jacobson Holman PLLC

(57) ABSTRACT

An artificial line, particularly an artificial electric line, and specifically an artificial line having a constant group delay in a wide frequency range (octave bandwidths). The artificial line comprises two identical inductors of the magnitude L connected in series and having a mutual inductance M, and a capacitor of the magnitude $C_1$ over the inductors and a shunt capacitor $C_2$ to earth. The element values as a function of the cut-off frequency $f_c$ and the characteristic impedance $Z_0$ are selected according to specific equations. The artificial line can then be realized as a continuously tunable artificial line or as a self-switched artificial line. The two types of artificial lines can also be cascade-coupled.

10 Claims, 10 Drawing Sheets

ARTIFICIAL LINE

BACKGROUND OF THE INVENTION

1. Field of the Invention

The present invention relates to an artificial line, i.e. an artificial electric line, and specifically an artificial line having a constant group delay in a wide frequency range (octave bandwidths). The invention originates from delay lines for radar applications and will partly be described in connection with such applications. However, the invention can be applied in other contexts where an artificial line having the achieved properties can be used. Therefore the inventor aims at protecting the artificial line by a patent, based on its construction and its properties and independently of the place where it is used.

2. Description of the Related Art

Advanced future radar installations will be based on phased array antennas. Since such antennas may have hundreds of modules, monolithic integrated microwave circuits (MMIC) are necessary to minimize size and weight. Most prior-art microwave systems with phased array antennas are provided with binary control devices. In large installations, a great number of control wires will be involved since each element must be controlled individually. If an analog control device could be used, much would be gained since only one control wire or a few control wires would be required.

For installations requiring a great instantaneous bandwidth, phase shifters cannot be used since they cause a change in the beam direction, phase squinting, and distortion of the pulses, pulse stretching. Therefore, the present invention instead uses a special embodiment of a controllable delay element since such elements allow frequency-independent beam steering. Prior-art controllable delay elements are digital, which causes losses. Besides they are expensive.

FIG. 1 shows a prior-art binary 4-bit delay element using single-pole double-throw (SPDT) switches. Single-pole double-throw switches have considerable losses, which means that the prior-art delay element all in all exhibits great losses. If in FIG. 1 the delay Δt is 8 ps, the maximum delay will be 120 ps.

SUMMARY OF THE INVENTION

The present invention solves the above problem by providing an artificial line with controllable delay and low losses and at a, relatively seen, low cost by being designed as an artificial line in the form of a two-port network with an essentially frequency-independent mirror impedance, which in a first state comprises two identical inductors of the magnitude L, connected in series and having a mutual inductance M, and a capacitor of the magnitude $C_1$ over the inductors and a shunt capacitor $C_2$ to earth, the artificial line being adapted to give the same group delay—the same amount of delay—in a wide frequency range by the element values as a function of the cut-off frequency $f_c$ and the characteristic impedance $Z_0$ being selected according to the inductance, mutual inductance and capacitance equations $$\begin{cases} L[nH] = 107.4 \cdot 10^{-3} \dfrac{Z_0}{f_C[GHz]} \\ M[nH] = 51.72 \cdot 10^{-3} \dfrac{Z_0}{f_C[GHz]} \\ C_1[pF] = 27.85 \cdot 10^{-3} \dfrac{1}{Z_0 \cdot f_C[GHz]} \\ C_2[pF] = 318.3 \cdot 10^{-3} \dfrac{1}{Z_0 \cdot f_C[GHz]} \end{cases}$$

According to advantageous embodiments of the invention, the artificial line is a self-switched artificial line and can take a second state with a short delay by the capacitor $C_1$ being replaced by a short-circuit. The capacitor $C_1$ may be realized as a first switching element (FET 1, 4a) optimized to take, in dependence on its control voltage, two distinct states, a first state corresponding to a capacitance of the value $C_1$, which gives the artificial line a long delay, and a second state corresponding to a short-circuit with low impedance, which gives the artificial line a short delay. The first switching element (FET 1, 4a) may be realized as a first field effect transistor. Further, a second switching element (FET 2, 4b) with properties corresponding to those of the first switching element (FET 1, 4a) may be arranged in series with the capacitor $C_2$, the second switching element being driven complementarily with the first switching element.

According to the present invention, the artificial line may be made in a planar monolithic circuit technique, where the inductors and the mutual inductance are realized as coupled microstrip lines (3), and the short-circuit which is formed in the second state of the circuit comprises the first switching element (FET 1, 4a) and two insulating crossovers (5a, 5b) of the microstrip lines and forms the shortest possible transfer path between input (1) and output (2). The short circuit which is formed in the second state of the circuit may also comprise the first switching element (FET 1, 4a), one of the coupled microstrip lines (3b) and an insulating crossover (5) of a microstrip line.

Furthermore, a plurality of artificial lines may be cascade-coupled with a control voltage for the entire composed artificial line being applied to the different artificial lines in series via intermediate impedances R, such that a respective artificial line changes its state in turn as the control voltage increases.

According to a further advantageous embodiment, the artificial line may be a continuously tunable artificial line by the capacitors $C_1$ and $C_2$ being designed as varactors, in which a first range within which the group delay GD should be tunable is selected, whereupon this is transferred to a range of the cut-off frequency $f_0$ according to the equation $$GD(\omega) = \frac{2}{\omega_C} \cdot \frac{1 + k\Omega^2}{(1 - k\Omega^2)^2 + \Omega^2}, \qquad \text{(equation 17)}$$

whereupon a cut-off frequency within this range is selected, followed by a choice of L and M at the selected frequency according to the inductance, mutual inductance and capacitance equations defined herein. Capacitances of the varactors are variable, such that the artificial line gives the delay which is intended in each moment, according to equation 17, the calculation occurring via a frequency value obtained from the inductance, mutual inductance and capacitance equations defined herein. In accordance with this embodiment, the artificial line is made in a planar monolithic circuit technique, where the inductors and the mutual inductance are realized as coupled microstrip lines (3), the varactor $C_1$ ($C_{V1}$) consists of a field effect transistor (4a) where the drain and source are inter-connected and the bias for tuning is applied to its gate and the varactor $C_2$ ($C_{V2}$) consists of a field effect transistor (4b) coupled and biased in a manner corresponding to that of the first-mentioned field effect transistor (4a). Finally, at least one self-switched artificial line may be cascade-coupled to the tunable artificial line.

These together with other objects and advantages which will become subsequently apparent reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

The invention will now be described in more detail with reference to the accompanying drawings, in which.

DETAILED DESCRIPTION OF THE PREFERRED EMBODIMENTS

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

The invention concerns basically an artificial line which in a first state has the desired properties in respect of constant group delay in a wide frequency range. The artificial line can then be accomplished as a continuously tunable artificial line or as a self-switched artificial line.

Figure 1:
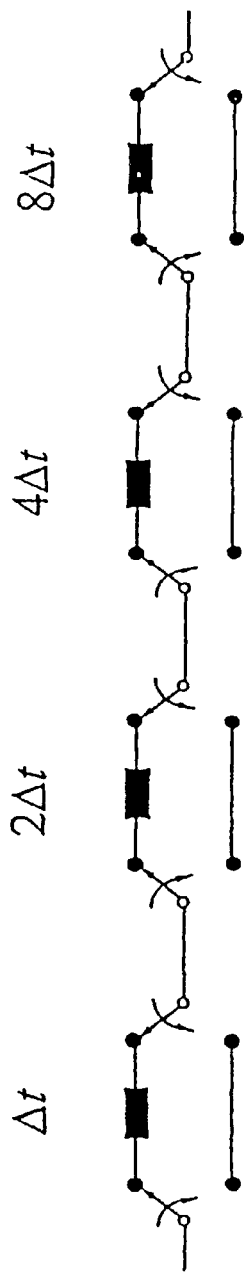
FIG. 1 shows a prior-art four-bit delay line with SPDT switches.
Figure 2:
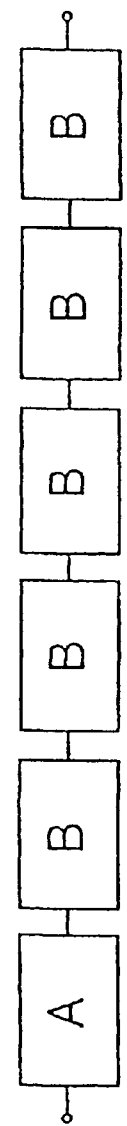
FIG. 2 is a basic sketch of an assembled artificial line according to an embodiment of the invention, which has a continuously variable delay over a large time interval.

FIG. 2 illustrates how, in one embodiment, it would be possible to build a composed artificial line which can delay signals by a total of 120 ps, the same as in the previous case of the prior-art artificial line. Here use is made of a tunable artificial line A as well as self-switched artificial lines B. The continuously tunable artificial line has, in dependence on a control signal, a delay of up to about 20 ps. In the example, five self-switched artificial lines are cascade-coupled to this artificial line. The self-switched artificial line can take two distinct states. In one state, it has a small delay, and in the other a large delay, in the example at issue about 20 ps. The self-switched artificial lines can be controlled by a single control wire, which means a considerable simplification.

Below follows first a theoretical derivation of how an artificial line of the type at issue should be designed. The self-switched artificial line follows this derivation, and the tunable artificial line takes its starting point in the derivation.

Both types of artificial lines are based on an all-pass network with a frequency-independent mirror impedance (constant-R all-pass network). In the tunable case, it is more correct to speak of essentially frequency-independent mirror impedance (quasi constant-R . . . )

Figure 3A:
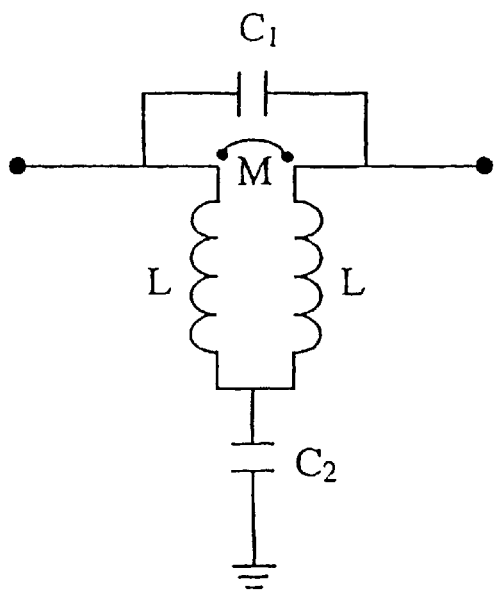
FIG. 3a is a flow diagram of a known all-pass network.

FIG. 3a illustrates a known all-pass network. It consists of a bridged T-section consisting of two mutually coupled inductors of equal value L, which form the two arms, a capacitor $C_2$ to earth, forming the vertical arm, and a capacitor $C_1$ coupled over the inductors. Under specific conditions, this network becomes an all-pass network having a constant input impedance which is independent of frequency.

Figure 3B:
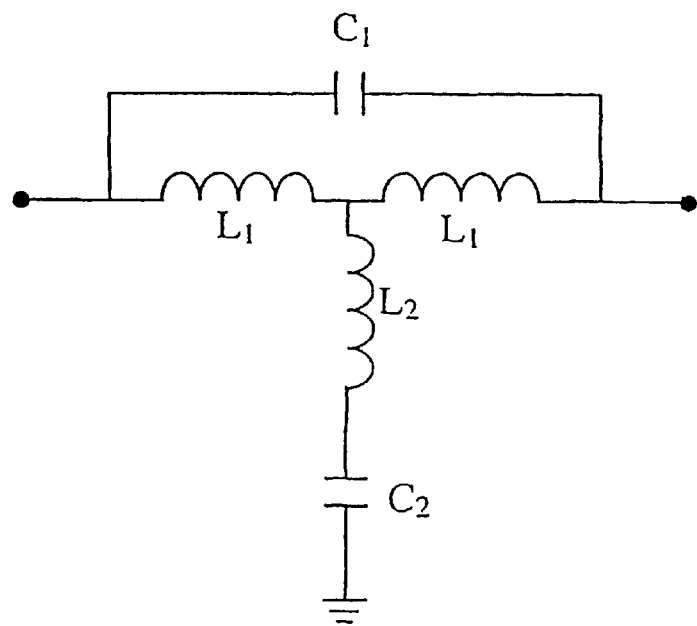
FIG. 3b is an equivalent diagram of the all-pass network in FIG. 3a, FIG. 4 is a diagram of $\omega_0 GD(\omega)$ as a function of $\omega/\omega_0$ for different K values.

To determine the scattering parameters, the T network is transformed by the inductive coupling being drawn as a network equivalent, see FIG. 3b, where:

$$L_1 = L + M \quad (1)$$

and $$L_2 = -M \quad (2)$$

The symmetry of the circuit implies that the calculations are reduced. All scattering parameters can be derived from the reflection coefficients $\Gamma_e$ and $\Gamma_0$. $\Gamma_e$ is the result of two equal voltages of the same sign being applied to the two-port network. $\Gamma_0$ is the result of two equal voltages of opposite sign being applied to the two ports. The scattering parameters $S_{ij}$ for the network are obtained as follows:

$$S_{11} = S_{22} = \frac{\Gamma_e + \Gamma_0}{2} \quad (3)$$

$$S_{21} = S_{12} = \frac{\Gamma_e + \Gamma_0}{2} \quad (4)$$

$\Gamma_e$ and $\Gamma_0$ can be expressed in the normalized even and odd mode impedances $Z_e$ and $Z_0$ as $$\Gamma_e = \frac{1-Z_e}{1+Z_e} \quad (5)$$

$$\Gamma_0 = \frac{1-Z_0}{1+Z_0} \quad (6)$$

where $$Z_e = j\omega(L_1 + 2L_2) + \frac{2}{j\omega C_2} \quad (7)$$

and $$Z_0 = \frac{j\omega L_1}{1 - 2\omega^2 L_1 C_1} \quad (8)$$

By inserting equations (5) and (6) in (3) and (4), the following is obtained:

$$S_{11} = \frac{1 - Z_e Z_0}{(Z_e + 1)(Z_0 + 1)} \quad (9)$$

$$S_{21} = \frac{Z_e - Z_0}{(Z_e + 1)(Z_0 + 1)} \quad (10)$$

It appears from (9) that if the network has to be matched at all frequencies, i.e. $S_{11}=0$ then the condition $Z_e Z_0=1$ must be fulfilled for all frequencies. This gives after some algebra $$\begin{cases} L_1 + 2L_2 = 2C_1 \\ 2L_1 = C_2 \end{cases} \quad (11)$$

Consequently, the transmission coefficient $S_{21}$ becomes $$S_{21} = \frac{Z_e - 1}{Z_e + 1} \quad (12)$$

By inserting (7) in (12), $S_{21}$ can be expressed as $$S_{21} = \frac{p^2 - ap + b}{p^2 + ap + b} \quad (13)$$

where $$p = j\omega, \quad a = \frac{1}{L_1 + 2L_2} \text{ and } b = \frac{2}{(L_1 + 2L_2)C_2}$$

The equation (13) shows that $S_{21}$ has the magnitude 1 and a phase response $ArgS_{21}$ which can be expressed as $$ArgS_{21} = -\arctan\left(\frac{\Omega}{1 - \frac{b}{a^2}}\right) \quad (14)$$

where $$\Omega = \frac{\omega}{\omega_c}$$

is the normalized angular frequency and $$\omega_c = \frac{b}{a},$$

where $$f_c = \frac{\omega_c}{2\pi}$$

is the cut-off frequency. The transfer function has a low pass character. The normalized circuit elements can now be expressed as functions of a and b. Insertion of the expressions for a and b in (12) results in $$\begin{cases} L_1 = \frac{a}{b} \\ L_2 = \frac{1}{2}\left(\frac{1}{a} - \frac{a}{b}\right) \\ C_1 = \frac{1}{2a} \\ C_2 = 2\frac{a}{b} \end{cases} \quad (15)$$

To be able to use the two-port network as a delay element, the transfer phase must have a linear frequency response. In other words, the group delay $GD(\omega)$ must be constant with frequency. The group delay can be expressed as follows $$GD(\omega) = -\frac{\partial Arg(S_{21})}{\partial \omega} \quad (16)$$

If (14) is inserted in (16) the following is obtained $$GD(\omega) = \frac{2}{\omega_c} \cdot \frac{1 + k\Omega^2}{(1 - k\Omega^2)^2 + \Omega^2} \quad (17)$$

where $$k = \frac{b}{a^2}.$$

Figure 4:
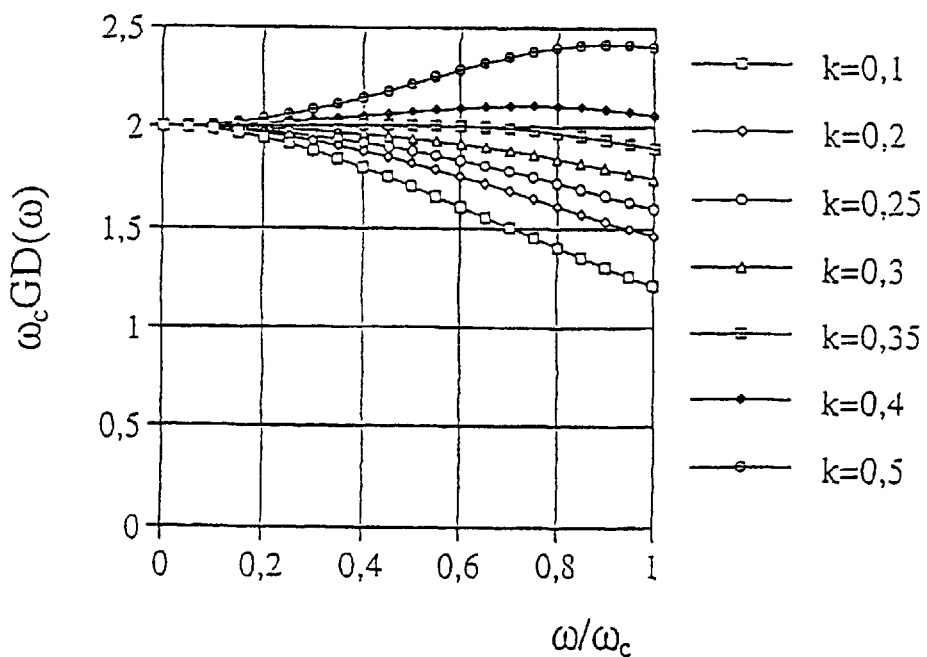

By plotting the product $\omega_c GD(\omega)$ as a function of $\Omega$ for different k values, it is easy to find the value which gives a constant group delay. This is done in FIG. 4, from which it is evident that k=0.35 is the appropriate value.

For a given transition frequency $$\omega_c = \frac{b}{a}$$

and an impedance level $Z_0$, one can determine explicitly the values of the circuit elements. They are given below as a function of the cut-off frequency $f_c$ and the characteristic impedance $Z_0$.

$$\begin{cases} L[nH] = 107.4 \cdot 10^{-3} \dfrac{Z_0}{f_C[GHz]} \\ M[nH] = 51.72 \cdot 10^{-3} \dfrac{Z_0}{f_C[GHz]} \\ C_1[pF] = 27.85 \cdot 10^{-3} \dfrac{1}{Z_0 \cdot f_C[GHz]} \\ C_2[pF] = 318.3 \cdot 10^{-3} \dfrac{1}{Z_0 \cdot f_C[GHz]} \end{cases} \quad (18)$$

Figure 5:
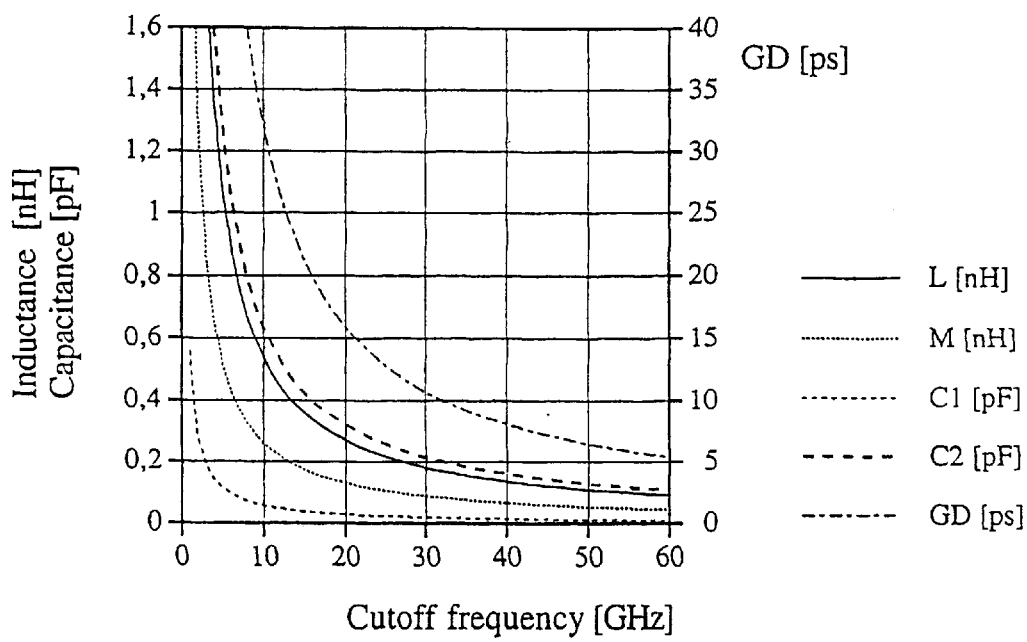
FIG. 5 illustrates group delay and component values as a function of the cut-off frequency.

The values of the circuit elements, according to equation (18), and the corresponding group delay, according to equation (17), are plotted in FIG. 5 as a function of the cut-off frequency for a device having a characteristic impedance $Z_0$ amounting to 50Ω.

After this fundamental review, we pass on to study an application of a first type of an inventive artificial line in the form of a self-switched artificial line for time delay purposes. The self-switched artificial line can take two states. In one state, the circuit has component values according to equation (18), which results in a large delay. In the second state, the capacitor $C_1$ is short-circuited, which gives a short delay.

Figure 6:
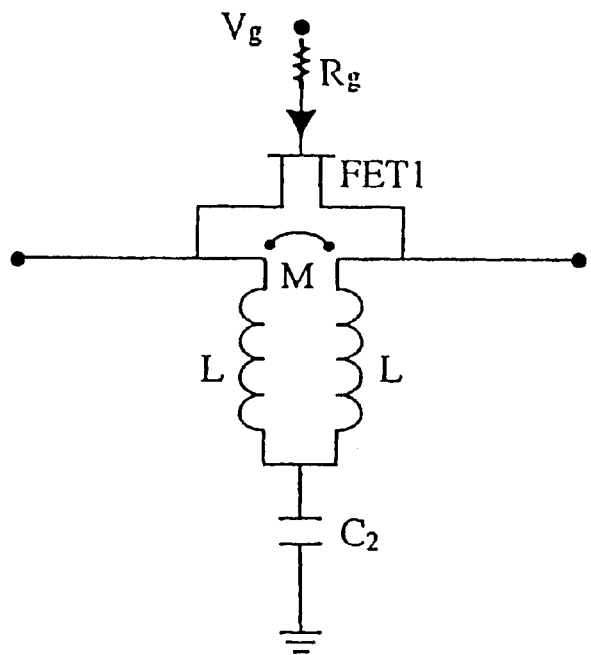
FIG. 6 is a flow diagram of a first variant of a self-switched artificial line according to an embodiment of the invention.

In the known circuit according to FIG. 3a, the capacitor $C_1$ can be implemented as a metal-insulator-metal (MIM) capacitor in an MMIC design. In the self-switched artificial line, the capacitor $C_1$ is exchanged for a first switching element which can be described as a small resistor in a first state (on-state) and a capacitor in a second state (off-state), e.g. a PIN diode, a bipolar transistor or a "switch-FET". In the case shown in FIG. 6, the switching element is a first field effect transistor FET 1 which is optimized to take, in dependence on its control voltage, two distinct states. In the one case, the transistor is biased to a conductive state, $V_G=0$. The transistor then corresponds to a very low resistance and the circuit behaves as a short transmission line shunted with $C_2$.

In the second case, the transistor is biased so as to be fully depleted, $|V_G|>|V_P|$, where $V_P$ is the pinch-off voltage of the transistor. The transistor then corresponds to a capacitor. If the transistor parameters are selected such that the capacitance of the transistor is $C_1$, the circuit obtains, according to the derivation which results in equation (18), a group delay which is independent of the frequency in a wide frequency range.

Figure 7:
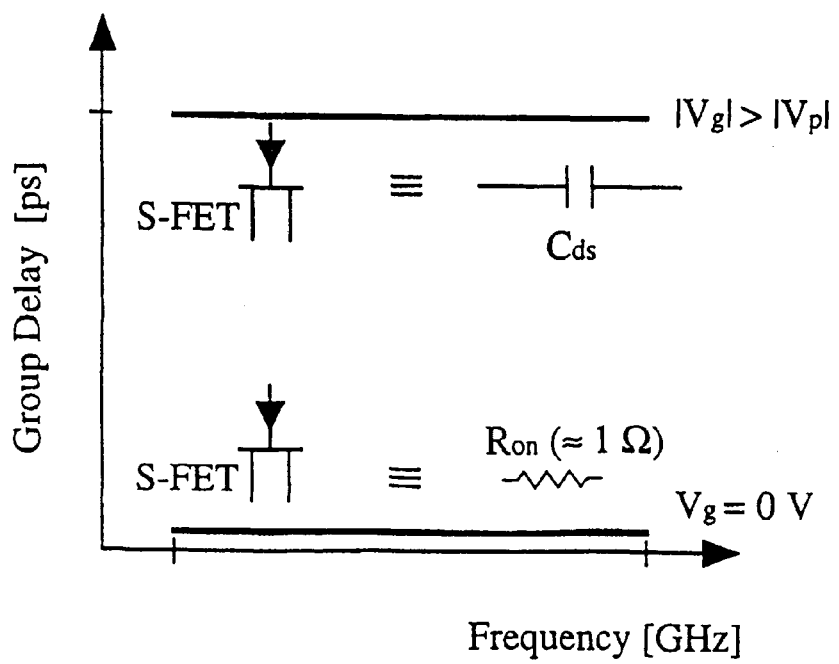
FIG. 7 is a diagram of the group delay as a function of the frequency for the artificial line in FIG. 6.

This results in the circuit, in dependence on the control voltage to the transistor, taking one of two states. In the first, the group delay is very short and in the other the delay is long, which is shown in FIG. 7.

Figure 8:
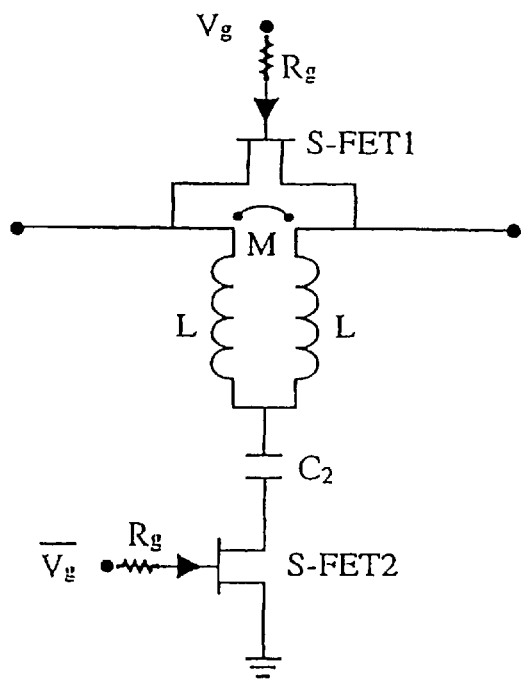
FIG. 8 is a flow diagram of a second variant of a self-switched artificial line according to an embodiment of the invention.

The shunt capacitor $C_2$, however, is normally not small enough to give a high impedance to the line when the first field effect transistor FET 1 is in the first state. This results in a deterioration of the scattering properties, especially at high frequencies. A solution to this is to connect a second switching element, of a type similar to the first one, in series with the capacitor $C_2$. This second switching element is driven complementarily with the first, i.e. when the first is conductive, the second is fully depleted and vice versa. In this way, the line becomes shunted by a high impedance compared with $C_2$ only. FIG. 8 shows a variant of this advantageous embodiment of the invention with a second field effect transistor, FET 2, optimized to take, in dependence on its control voltage, two distinct states, as the second switching element.

Figure 9:
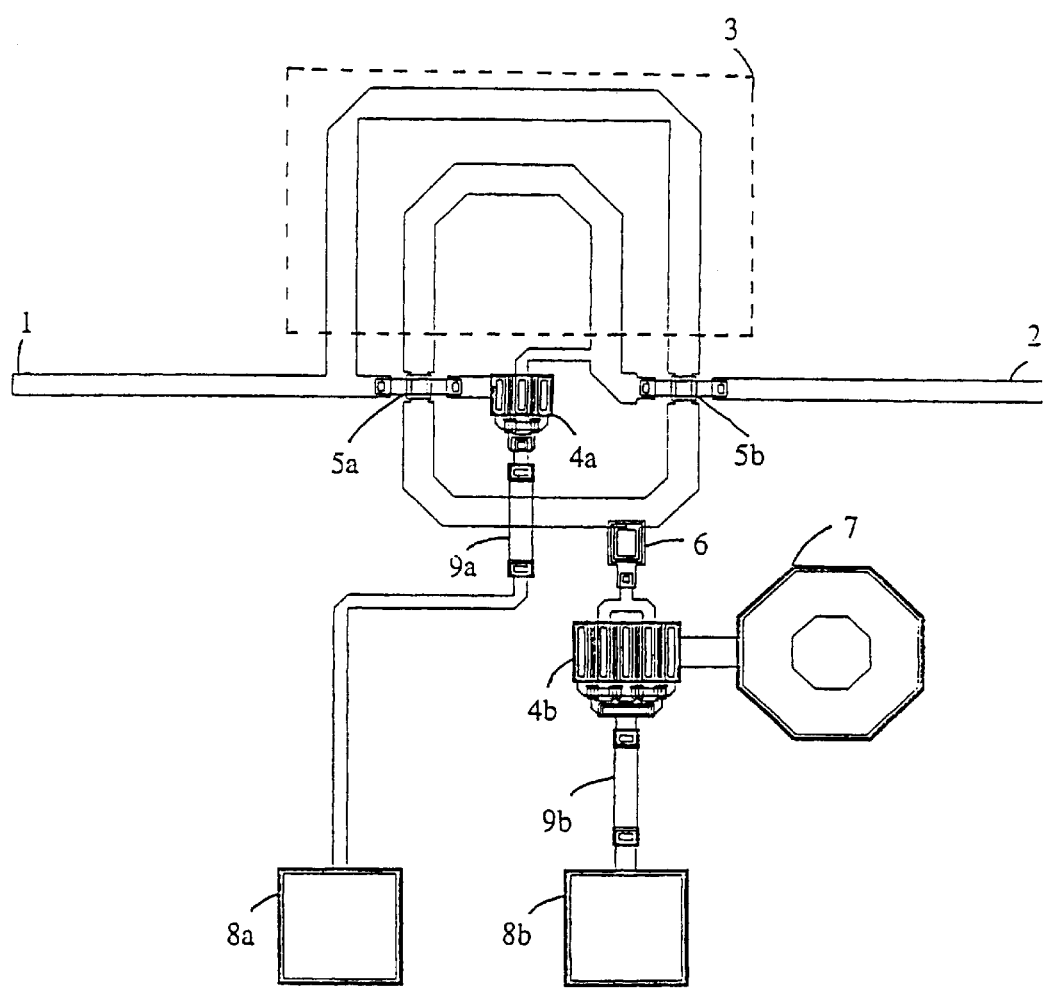
FIG. 9 illustrates a first concrete example of a self-switched artificial line according to an embodiment of the invention.
Figure 10:
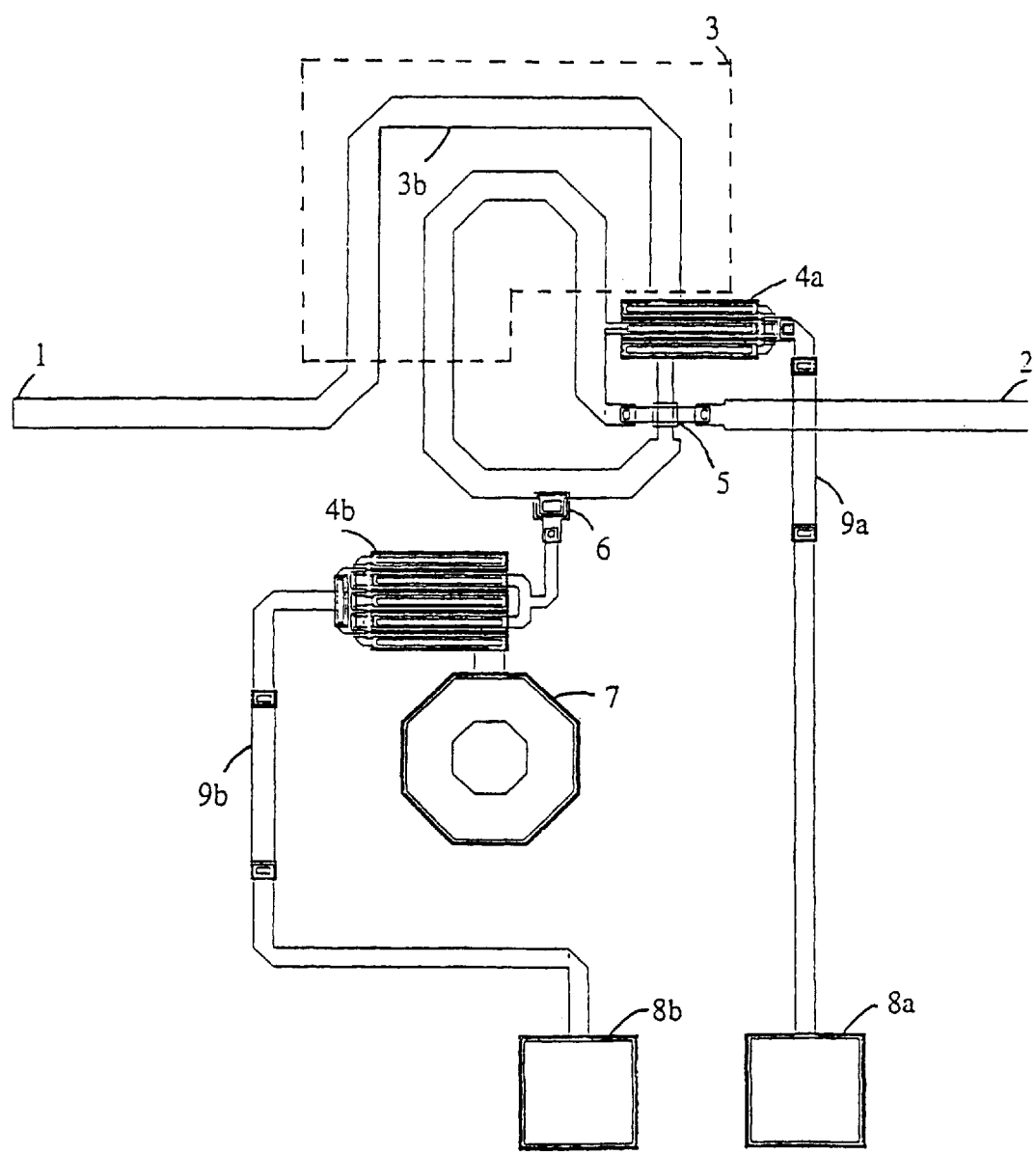
FIG. 10 shows a second concrete example of a self-switched artificial line according to an embodiment of the invention.

Two examples of a concrete layout for a self-switched artificial line in a planar monolithic circuit technique are shown in FIGS. 9 and 10. In this case, the cut-off frequency is selected to be 18 GHz and the characteristic impedance to be 50Ω. The desired element values are the same in the two examples. The embodiments result in different group delay owing to the different geometric design of the circuits, which will be described below. The embodiments in the figures are drawn according to scale for accomplishment on a 100 μm-thick GaAs substrate having the permitivity 12.8.

FIG. 9 shows an embodiment in which the largest possible difference in group delay between the two states of the circuit is desired. The circuit has an input 1 and an output 2. The inductances and the mutual inductance are realised as coupled microstrip lines 3. The coupled microstrip lines are arranged such that the short-circuited shunt formed of FET 1=4a in the conductive state (i.e. when the circuit takes the state with a short group delay) is the shortest possible transmission path between input 1 and output 2. This is achieved by using two insulating crossovers 5a and 5b. To earth extends $C_2$, designed as a plate capacitor 6, usually an MIM, in series with FET 2=4b, whose source is connected with a via hole 7 to the ground plane of the circuit. The bias of FET 1 and FET 2 is applied to the bonding pads 8a and 8b, respectively, and is supplied to the gate via the respective resistors 9a and 9b which are here designed as doped channels in the substrate with controlled resistivity.

FIG. 10 shows an embodiment in which a smaller difference in group delay between the two states of the circuit is desired. The circuit has an input 1 and an output 2. The inductances and the mutual inductance are realised as coupled microstrip lines 3. The short-circuited shunt formed of FET 1=4a in conductive state (i.e. when the circuit takes the state with a short group delay) is here a comparatively longer path between input 1 and output 2 by one of the coupled microstrip lines 3b being included in the shunt between the input and the output. In this case only one insulating crossover 5 is necessary. To earth extends $C_2$, designed as a plate capacitor 6, usually an MIM, in series with FET 2=4b, whose source is connected to a viahole 7 to the earth plane of the circuit. The bias of FET 1 and FET 2 is applied to the bond plates 8a and 8b, respectively, and is supplied to gate via the respective resistors 9a and 9b, which are here designed as doped channels in the substrate with controlled resistivity.

Figure 12:
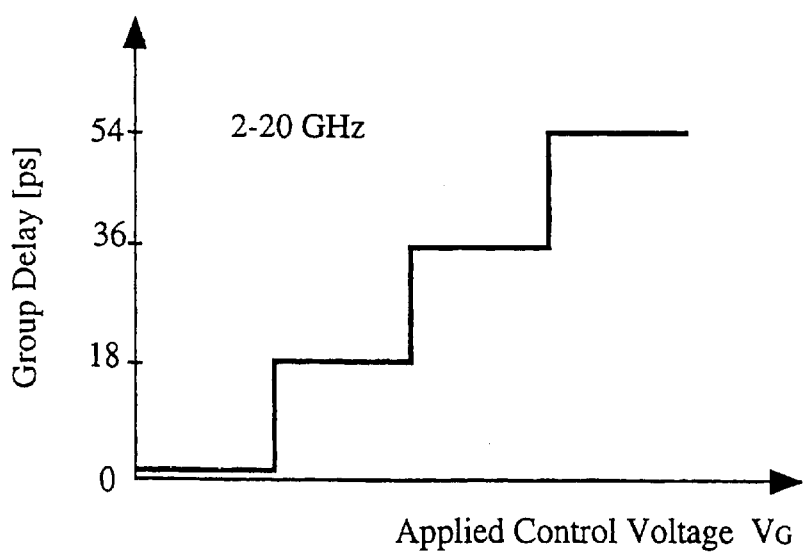
FIG. 12 is a diagram of the group delay as a function of the applied control voltage for the cascade-coupled artificial line in FIG. 11.
Figure 11:
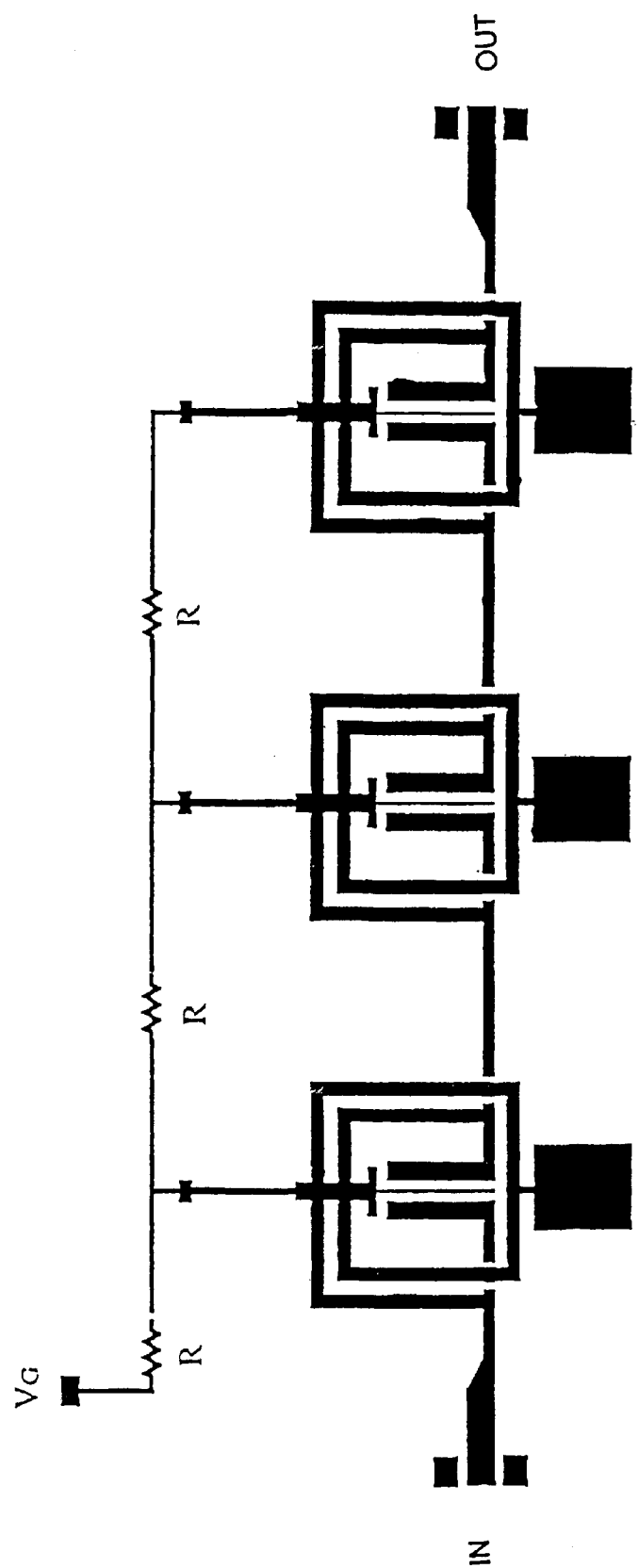
FIG. 11 shows a concrete example of a plurality of cascade-coupled artificial lines according to an embodiment of the invention.

The layout according to FIGS. 9 and 10 is cascadable, and therefore a composed artificial line can be effected. FIG. 11 shows an example of cascade-coupled self-switched artificial lines. By the control voltage to the respective first field effect transistor and, if necessary, the respective second field effect transistor, is applied to the different artificial lines in series via intermediate impedances R, the respective artificial line changes its state in turn at an increasing control voltage, see FIG. 12. Thus, only one control wire is required.

Regarding a continuously tunable artificial line which can be used alone or together with the self-switched artificial line as stated above, it can be realised in a manner similar to that of the self-switched artificial line. The theoretical values of the circuit elements are calculated in a manner corresponding to the previous manner. For a given characteristic impedance, element values are selected by first selecting a range within which the group delay GD should be unable and transferring, via the diagram in FIG. 5, this to a range of the cut-off frequency $f_c$. Then a cut-off frequency is selected in the middle of this range. L and M are selected, based on the selected cut-off frequency, according to equation (18) and FIG. 5.

Figure 13:
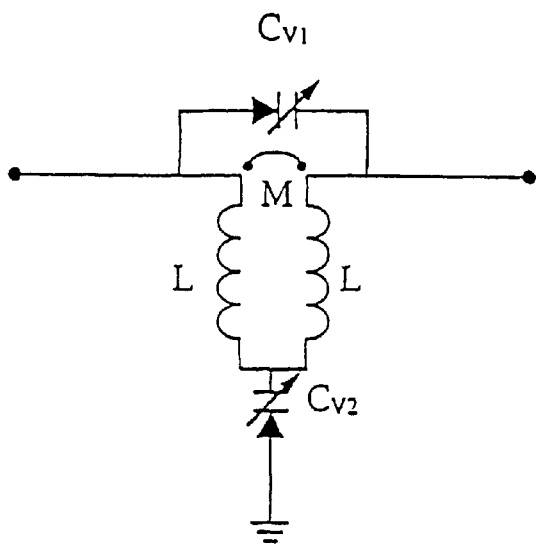
FIG. 13 is a flow diagram of an embodiment of a tunable artificial line according to the invention.
Figure 14:
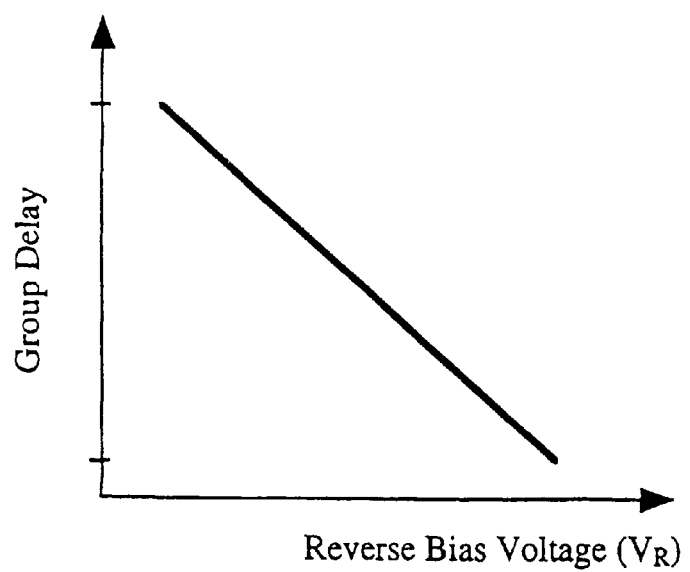
FIG. 14 is a diagram of the group delay as a function of the applied negative control voltage for the artificial line in FIG. 13.

Finally the continuously tunable group delay is achieved by the capacitors $C_1$ and $C_2$ in the two-port network according to FIG. 3a being replaced by varactors, see FIG. 13. The varactors are selected such that their capacitances $C_1$ and $C_2$ are variable and follow the curves in FIG. 5 in the range for the desired variation of the group delay. The inductances L and the mutual inductance M will not follow the relation exactly, and therefore the properties of the circuit are slightly deteriorated. In a variation of the group delay within the range of 5–15 ps, the deterioration of the input and output impedance is normally acceptable. It is in this case more correct to speak about an essentially frequency-independent mirror impedance (quasi constant-R . . . ).

Figure 15:
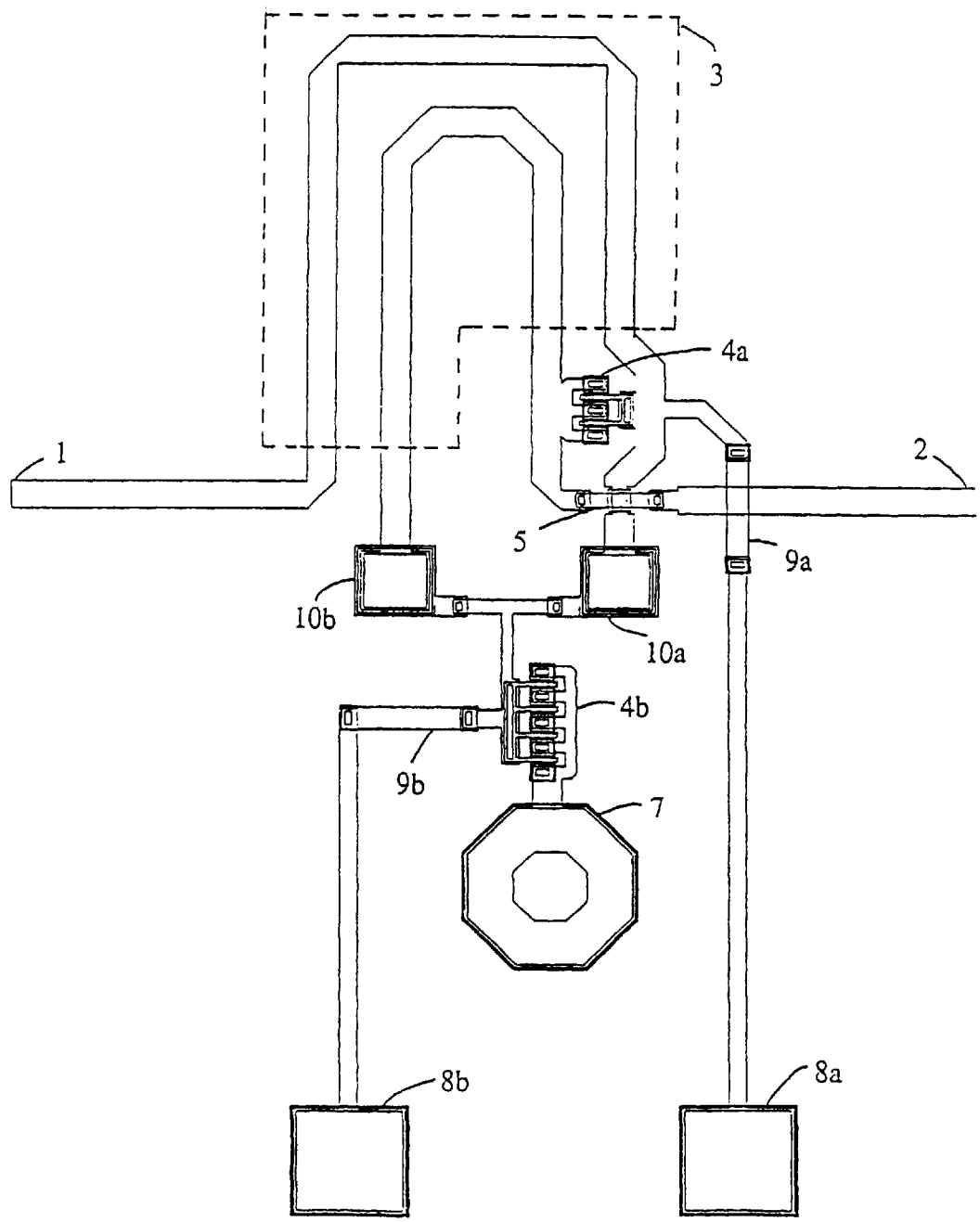
FIG. 15 shows a concrete example of a tunable artificial line according to an embodiment of the invention.

FIG. 15 illustrates an example of a layout for a tunable artificial line. The circuit has an input 1 and an output 2. The inductances and the mutual inductance are realised as coupled microstrip lines 3. The voltage-controlled capacitance $C_{V1}$ is designed as a varactor consisting of a field effect transistor 4a where the drain and source are interconnected and the bias for tuning is applied to its gate. The voltage-controlled capacitance $C_{V2}$ is also designed as a varactor 4b composed in the same manner as the first-mentioned varactor 4a. The drain and source of this varactor 4b are connected to the ground plane of the circuit with a via hole 7. The design uses an insulating crossover 5. The voltage for tuning of $C_{V1}$ and $C_{V2}$ is applied to the bonding pads 8a and 8b respectively and is supplied to the gate via the respective resistors 9a and 9b which are here designed as doped channels in the substrate with controlled resistivity. Two MIM capacitors 10a and 10b have been introduced for the varactors to be biased.

The invention being thus described, it will be obvious that the same may be varied in many ways. Such variations are not to be regarded as a departure from the spirit and scope of the invention, and all such modifications as would be recognized by one skilled in the art are intended to be included within the scope of the following claims.

What is claimed is:

1. An artificial line comprising a two-port network with an essentially frequency-independent mirror impedance, which in a first state includes two identical inductors of magnitude L, connected in series and having a mutual inductance M, a capacitor of magnitude $C_1$ over the inductors and a shunt capacitor $C_2$ to earth, said artificial line being adapted to give a same group delay in a wide frequency range by element values as a function of a cut-off frequency $f_c$ and a characteristic impedance $Z_0$ being selected according to inductance, mutual inductance and capacitance equations $$\begin{cases} L[nH] = 107.4 \cdot 10^{-3} \dfrac{Z_0}{f_C[GHz]} \\ M[nH] = 51.72 \cdot 10^{-3} \dfrac{Z_0}{f_C[GHz]} \\ C_1[nF] = 27.85 \cdot 10^{-3} \dfrac{1}{Z_0 \cdot f_C[GHz]} \\ C_2[nF] = 318.3 \cdot 10^{-3} \dfrac{1}{Z_0 \cdot f_C[GHz]} \end{cases}$$

said artificial line being a self-switched artificial line able to take a second state with a short delay by replacing the capacitor $C_1$ with a short-circuit.

2. The artificial line as claimed in claim 1, wherein the capacitor $C_1$ is a first switching element optimized to take, in dependence on its control voltage, two distinct states, a first state corresponding to a capacitance of the value $C_1$, which gives the artificial line a long delay, and a second state corresponding to a short-circuit with low impedance, which gives the artificial line a short delay.

3. The artificial line as claimed in claim 2, wherein the first switching element is a first field effect transistor.

4. The artificial line as claimed in claim 2, wherein a second switching element with properties corresponding to those of the first switching element is arranged in series with the capacitor $C_2$, said second switching element being driven complementarily with the first switching element.

5. The artificial line as claimed in claim 2, wherein said line is made in a planar monolithic circuit technique, where the inductors and the mutual inductance are realized as coupled microstrip lines, and the short-circuit which is formed in the second state of the circuit comprises the first switching element and two insulating crossovers of the microstrip lines and forms a shortest possible transfer path between input and output.

6. The artificial line as claimed in claim 2, wherein said line is made in a planar monolithic circuit technique, where the inductors and the mutual inductance are realized as coupled microstrip lines, and the short-circuit which is formed in the second state of the circuit comprises the first switching element, one of the coupled microstrip lines and an insulating crossover of a microstrip line.

7. The artificial line as claimed in claim 1, wherein a plurality of artificial lines are cascade-coupled and a control voltage for the entire composed artificial line is applied to the plurality of artificial lines in series via intermediate impedances R, such that a respective artificial line changes its state in turn as the control voltage increases.

8. An artificial line comprising a two-port network with an essentially frequency-independent mirror impedance, which in a first state includes two identical inductors of magnitude L, connected in series and having a mutual inductance M, a capacitor of magnitude $C_1$ over the inductors and a shunt capacitor $C_2$ to earth, said artificial line being adapted to give a same group delay in a wide frequency range by element values as a function of a cut-off frequency $f_c$ and a characteristic impedance $Z_0$ being selected according to inductance, mutual inductance and capacitance equations, said artificial line being a continuously tunable artificial line, said capacitors $C_1$ and $C_2$ being designed as varactors, and a first range within which a group delay GD should be tunable being selected, whereupon this selection is transferred to a range of cut-off frequency $f_0$ according to a group delay equation $$GD(\omega) = \frac{2}{\omega_C} \cdot \frac{1 + k\Omega^2}{(1 - k\Omega^2)^2 + \Omega^2}$$

whereupon a cut-off frequency within this range is selected, followed by a choice of L and M at the selected frequency according to said inductance, mutual inductance and capacitance equations, capacitances of the varactors being variable, such that the artificial line gives the delay which is intended in each moment, according to the group delay equation, calculation occurring via a frequency value obtained from said inductance, mutual inductance and capacitance equations.

9. The artificial line as claimed in claim 8, wherein said line is made in a planar monolithic circuit technique, where the inductors and the mutual inductance are realized as coupled microstrip lines, the varactor $C_1$ ($C_{V1}$) is a first field effect transistor where drain and source are interconnected and a bias for tuning is applied to its gate and the varactor $C_2$ ($C_{V2}$) is a second field effect transistor coupled and biased in a manner corresponding to that of said first field effect transistor.

10. The artificial line as claimed in claim 8, wherein said artificial line is a self-switched artificial line that can take a second state by replacing said capacitor $C_1$ with a short-circuit and is cascade-coupled to the tunable artificial line.

* * * * *

UNITED STATES PATENT AND TRADEMARK OFFICE
CERTIFICATE OF CORRECTION

PATENT NO. : 6,556,096 B1
DATED : April 29, 2003
INVENTOR(S) : Ouacha et al.

It is certified that error appears in the above-identified patent and that said Letters Patent is hereby corrected as shown below:

Column 7,
Equation (18), should be $$\begin{cases} L[nH] = 107.4 \cdot 10^{-3} \dfrac{Z_0}{f_C[GHz]} \\ M[nH] = 51.72 \cdot 10^{-3} \dfrac{Z_0}{f_C[GHz]} \\ C_1[nF] = 27.85 \cdot 10^{-3} \dfrac{1}{Z_0 \cdot f_C[GHz]} \\ C_2[nF] = 318.3 \cdot 10^{-3} \dfrac{1}{Z_0 \cdot f_C[GHz]} \end{cases}$$

Signed and Sealed this

Twentieth Day of July, 2004

JON W. DUDAS
*Acting Director of the United States Patent and Trademark Office*